United States Patent
Oh et al.

(10) Patent No.: US 6,219,631 B1
(45) Date of Patent: Apr. 17, 2001

(54) METHOD OF GENERATING R,C PARAMETERS CORRESPONDING TO STATISTICALLY WORST CASE INTERCONNECT DELAYS FOR COMPUTER SIMULATION OF INTEGRATED CIRCUIT DESIGNS

(75) Inventors: Soo-Young Oh; Won-Young Jung, both of Fremont, CA (US)

(73) Assignee: Ingenuus Corporation, Sunnyvale, CA (US)

( * ) Notice: Subject to any disclaimer, the term of this patent is extended or adjusted under 35 U.S.C. 154(b) by 0 days.

(21) Appl. No.: 09/328,624

(22) Filed: Jun. 9, 1999

(51) Int. Cl.[7] ..................... G06F 17/50

(52) U.S. Cl. ................... 703/14; 703/1; 703/2; 703/4; 716/5; 716/10

(58) Field of Search .............. 703/1, 2, 3, 13; 716/2, 4, 5, 6, 7, 8, 10

(56) References Cited

U.S. PATENT DOCUMENTS

| | | | |
|---|---|---|---|
| 5,301,118 | * 4/1994 | Heck et al. | 700/109 |
| 5,901,063 | * 5/1999 | Chang et al. | 716/4 |
| 6,018,623 | * 1/2000 | Chang et al. | 716/6 |

OTHER PUBLICATIONS

Nakagawa et al, "Circuit Impact and Skew–Corner Analysis of Stochastic Process Variation in Global Interconnect", IEEE International Conference on Interconnect Technology, pp. 230–232, May 1999.*

Sylvester et al, "Modeling the Impact of Back–End Process Variation on Circuit Performance", IEEE International Symposium on VLSI Technology, Systems, and Applications, pp. 58–61, Jun. 1999.*

Lugli, "The Monte Carlo Method for Semiconductor Device and Process Modeling", IEEE Transactions on Computer–Aided Design of Integrated Circuits and Systems, pp. 1164–1176, Nov. 1990.*

* cited by examiner

Primary Examiner—Kevin J. Teska
Assistant Examiner—Samuel Broda
(74) Attorney, Agent, or Firm—Victor Okumoto

(57) ABSTRACT

A method of generating R,C parameters corresponding to statistically worst case interconnect delays for computer simulation of integrated circuit designs, comprising the steps of: computing a statistically worst case interconnect delay from randomly generated material and geometry values characterizing an integrated circuit interconnect process; computing a representative set of material and geometry values corresponding to the statistically worst case interconnect delay; and computing R,C parameters corresponding to the statistically worst case interconnect delay from the representative set of material and geometry values.

10 Claims, 2 Drawing Sheets

METHOD OF GENERATING R,C PARAMETERS CORRESPONDING TO STATISTICALLY WORST CASE INTERCONNECT DELAYS FOR COMPUTER SIMULATION OF INTEGRATED CIRCUIT DESIGNS

FIELD OF THE INVENTION

The present invention generally relates to electronic design automation (EDA) software for semiconductor integrated circuit design and in particular, to a method of generating R,C parameters corresponding to statistically worst case interconnect delays for computer simulation of integrated circuit designs.

BACKGROUND OF THE INVENTION

In deep sub-micron semiconductor process technologies, interconnect delays can easily dominate gate propagation delays as major contributors to the total delay through signal paths of an integrated circuit device. Accordingly, it is important that interconnect delays, and in particular their associated resistance and capacitance ("R,C") parameters, be thoroughly and accurately accounted for in computer simulations of integrated circuit designs. Otherwise, unexpected timing problems in the resulting silicon may require time consuming and costly redesigns with little or no guidance on how to correct the problems.

One problem in accurately taking into account the effect of interconnect delays, however, is that interconnect material and geometry parameters are subject to significant process-induced variation. Although empirical data gathered from wafer samples fabricated in a given process provide distribution data for such process-induced variation, the determination of statistically worst case (i.e., "3-sigma" or "3-σ") interconnect delays from such data is not straightforward. Traditional skew-corner worst case analyses are computationally simple, but prove overly conservative.

One method different than such traditional skew-corner approach for obtaining statistically-based worst case delay and crosstalk for a critical net is described in "3-sigma Worst-Case Calculation of Delay and Crosstalk for Critical Net," by Norman Chang, Valery Kanevsky, Bill Queen, O. Sam Nakagawa, and Soo-Young Oh, presented at the 1997 ACM/IEEE International Workshop on Timing Issues in the Specification and Synthesis of Digital Systems in Austin, Tex., on Dec. 4–5, 1997.

One problem with this method, however, is that it only provides worst case delay information for a critical net, and provides no useful information for other nets in the integrated circuit design. Another problem is that the obtained delay information is not applicable to other integrated circuit designs, or even the same integrated circuit design if a subsequent re-layout of the integrated circuit design results in the given net changing its length or route due to re-placement and/or re-routing of the integrated circuit design. Yet another problem is that this method is very slow since it employs extensive use of time consuming Monte Carlo circuit simulations via SPICE. Consequently, such method is generally inadequate for electronic design automation ("EDA") purposes.

OBJECTS AND SUMMARY OF THE INVENTION

Accordingly, it is an object of the present invention to provide a method of generating R,C parameters corresponding to statistically worst case interconnect delays for computer simulation of integrated circuit designs.

Another object is to provide a method of generating R,C parameters corresponding to statistically worst case interconnect delays for computer simulation of integrated circuit designs such that the R,C parameters are of unit length so as to be independent of a given net or integrated circuit design.

Yet another object is to provide a method of generating R,C parameters corresponding to statistically worst case interconnect delays for computer simulation of integrated circuit designs such that the R,C parameters are functions of different interconnect arrangements, and ranges of interconnect widths and thicknesses.

Still another object is to provide an efficient method of generating R,C parameters corresponding to statistically worst case interconnect delays for computer simulation of integrated circuit designs so as to minimize computer processing time to generate such R,C parameters.

These and additional objects are accomplished by the various aspects of the present invention, wherein briefly stated, one aspect is a method of generating R,C parameters corresponding to statistically worst case interconnect delays for computer simulation of integrated circuit designs, comprising the steps of: (a) computing a statistically worst case interconnect delay from randomly generated material and geometry values characterizing an integrated circuit interconnect process; (b) computing a representative set of material and geometry values corresponding to the statistically worst case interconnect delay; and (c) computing R,C parameters corresponding to the statistically worst case interconnect delay from the representative set of material and geometry values.

Additional objects, features and advantages of the various aspects of the present invention will become apparent from the following description of its preferred embodiments, which description should be taken in conjunction with the accompanying drawings.

DETAILED DESCRIPTION OF THE PREFERRED EMBODIMENT

Figure 1:
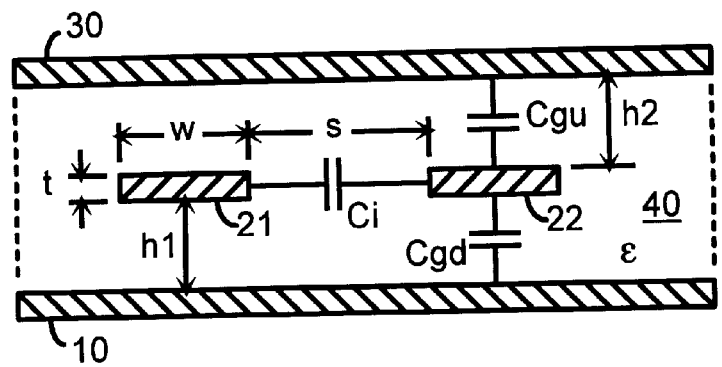
FIG. 1 illustrates a two-dimensional cross section of an integrated circuit detailing material and geometry values associated with one of its interconnects.

FIG. 1 illustrates, as an example, a two-dimensional cross section of an integrated circuit detailing portions of its interconnects to define material and geometry values associated with the interconnects. The structure comprises an active array 21, 22 in a metal layer on top of an orthogonal metal array 10 and below another orthogonal metal array 30. By convention, metal array 10 is referred to as metal 1 or M1, metal array 21, 22 is referred to as metal 2 or M2, and metal array 30 is referred to as metal 3 or M3. Individual runs of metal connecting coupled gates are referred to as interconnects. The metal layers are separated and supported by interlayer dielectric material 40 having a dielectric constant ("ϵ"). Other material and geometry values include coupling capacitance per unit length ("Ci") between adjacent interconnects of metal array 21, 22; capacitance per unit length ("Cgu") between interacting portions of the active array 21, 22 and the orthogonal array 30 above; and capacitance per unit length ("Cgd") between interacting portions of the active array 21, 22 and the orthogonal array 10 below. Still other material and geometry values include height ("h1") of the interlayer dielectric material 40 between the active array 21, 22 and the orthogonal passive array 10 below it, and height ("h2") of the interlayer dielectric 40 between the array 21, 22 and the orthogonal passive array 30 above it. Other material and geometry values for M2 include its thickness ("t"), its width ("W"), its spacing ("S") between adjacent cords 21 and 22, its resistivity ("$\rho$"), and resistance per unit length ("R") as determined from t, W and $\rho$. Although not shown, corresponding material and geometry values may be defined for other metallization layers.

Figure 2:
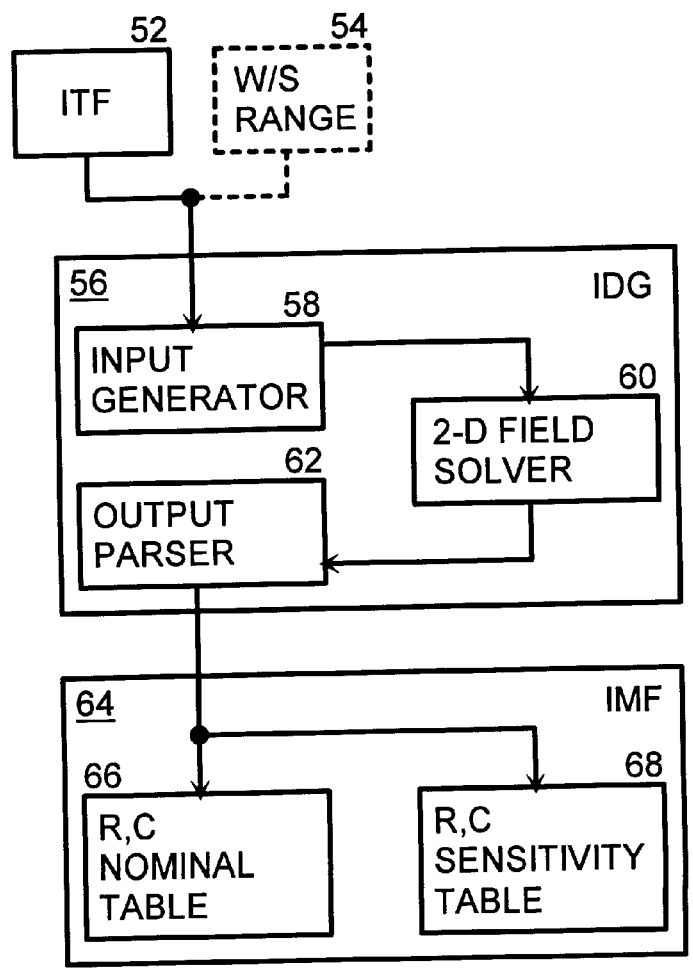
FIG. 2 illustrates a module diagram for generating an interconnect model file.

FIG. 2 illustrates, as an example, a module block diagram for generating an interconnect model file ("IMF") 64. The IMF 64 includes an R,C nominal table 66 and a corresponding R,C sensitivity table 68 for each type of interconnect arrangement in an integrated circuit design. The R,C nominal table 66 provides nominal R,C parameters for specified ranges of widths and spacings, and the R,C sensitivity table 68 provides sensitivity data for R,C parameters with respect to changes in material and geometry values for specified ranges of widths and spacings. Typically, the sensitivity data are in the form of partial derivatives such as, for example, $\partial Cgd/\partial h1$, $\partial Cgd/\partial w$, and $\partial Cgd/\partial \epsilon$.

Data for the IMF 64 is generated by a 2-D field solver 60 from data provided in an interconnect technology file ("ITF") 52 and a width/spacing ("W/S") range file 54. The 2-D field solver 60 is preferably a commercially available software module such as Raphael® from Avant! Corporation. On the other hand, a more sophisticated 3-D field solver can alternatively be used. The ITF 52 comprises statistical data of material and geometry values measured from silicon wafers manufactured in the fabrication process being used for the integrated circuit design, such as, for example, a 0.18 $\mu$m CMOS process with four layers of metal. Typically, the statistical data are in the form of a nominal or mean value, followed by 3-sigma values, as determined from such empirical measurements. The W/S range file 54 comprises ranges for both widths and spacings for each interconnect arrangement in the integrated circuit design (e.g., M3 over M2, or M2 over M1, or M1 over substrate, etc). As indicated by the dotted lines, this data may be input by a separate file such as W/S range file 54, or alternatively, may be generated automatically by an input generator 58 having a primary function of formatting or translating data read from the ITF 52 and the WIS range file 54 into input data as required by the 2-D field solver 60. An output parser 62 reads data output from the 2-D field solver 60, and generates from such, the R,C nominal table 66 and the R,C sensitivity table 68.

Figure 3:
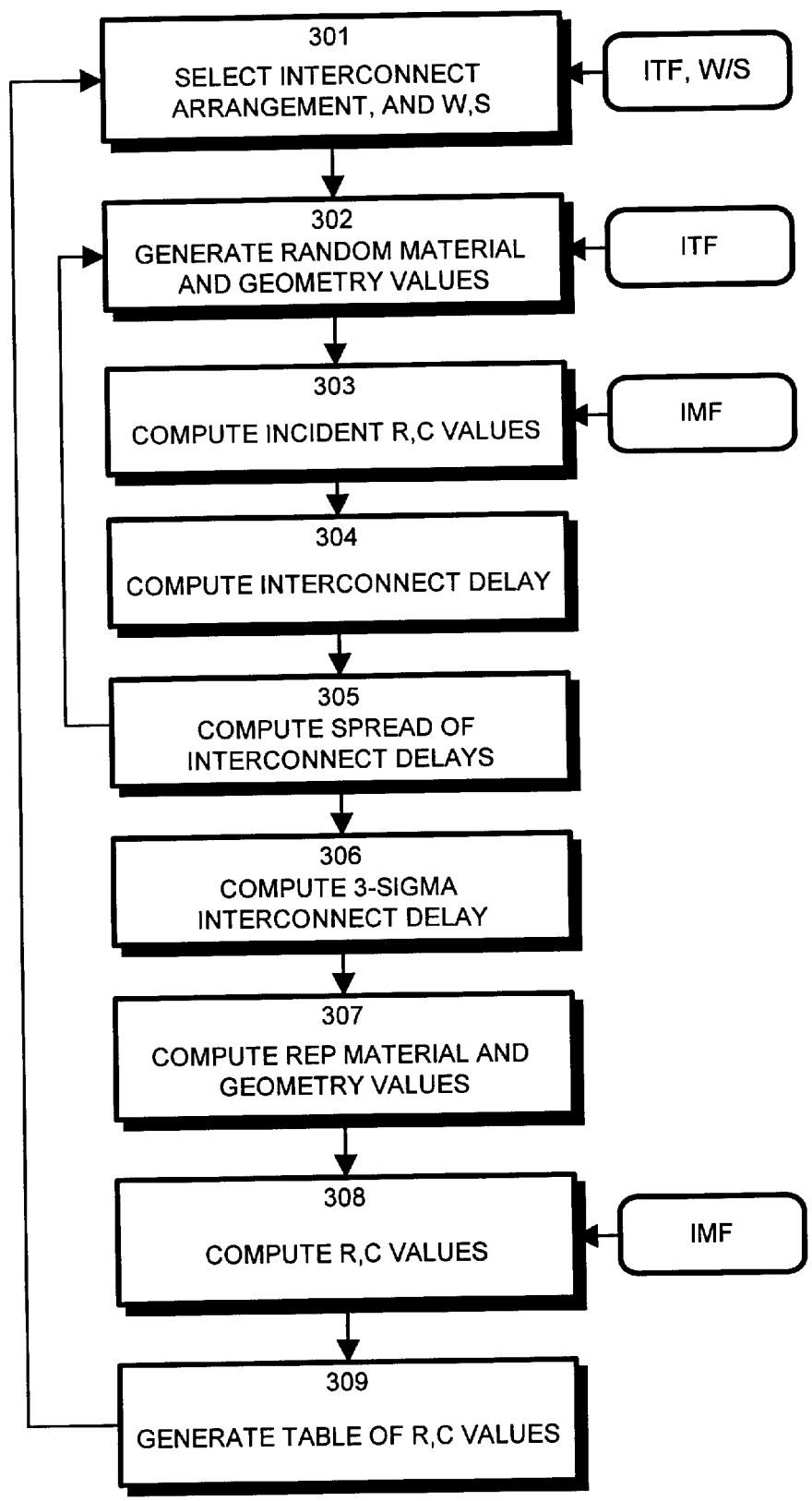
FIG. 3 illustrates a flow diagram of a method of generating R,C parameters corresponding to statistically worst case interconnect delays for computer simulation of integrated circuit designs.

FIG. 3 illustrates, as an example, a flow diagram of a method generating R,C parameters corresponding to statistically worst case interconnect delays for computer simulation of integrated circuit designs. Preferably, the R,C parameters are stored in a look-up table as a function of interconnect arrangements provided for in the ITF 52, and interconnect width and spacings provided for in the W/S range file 54. As can be appreciated, such a look-up table of R,C parameters corresponding to statistically worst case interconnect delays is especially useful in conjunction with various EDA software during the design process.

In step 301, a computer (not shown) selects a first interconnect arrangement and a first set of interconnect width and spacing respectively from the ITF 52 and the WIS range file 54.

In steps 302~305 the computer performs the step of computing a statistically worst case interconnect delay from randomly generated material and geometry values characterizing an integrated circuit interconnect process.

In particular, in step 302, the computer performs the step of randomly generating a set of material and geometry values (e.g., $\epsilon^*$, h1*, h2*, t*, $\rho^*$, W*, S*) from empirical data generated for a selected interconnect arrangement (e.g., M2 over M1), nominal width (e.g., W1) and nominal spacing (e.g., S1), characterizing the integrated circuit interconnect process. Preferably, it does this by performing a Monte Carlo simulation on material and geometry values statistically derived from the integrated circuit interconnect process. As previously described, such statistical data is available in the ITF 52.

In step 303, the computer performs the step of computing incident R,C parameters (e.g., R*, Ci*, Cgu*, Cgd*) from the randomly generated material and geometry values. Preferably, it does this by retrieving R,C nominal and sensitivity parameters corresponding to the selected interconnect arrangement, nominal width and spacing, from the IMF 64; and computing incident R,C parameters by adding to each of the retrieved R,C nominal parameters, (corresponding retrieved R,C sensitivity parameters multiplied by (differences between nominal material and geometry values corresponding to the randomly generated material and geometry values and the randomly generated material and geometry values)).

As one example, $$Cgd(\text{incident}) = Cgd(\text{nominal}) + [Cgd/\partial h1]^*\Delta h1 + [\partial Cgd/\partial w]^*\Delta W + [\partial Cgd/\partial \epsilon]^*\Delta \epsilon;$$

where $$\Delta h1 = h1(\text{nominal}) - h1(\text{random}),$$

$$\Delta W = W(\text{nominal}) - W(\text{random}), \text{ and}$$

$$\Delta \epsilon = \epsilon(\text{nominal}) - \epsilon(\text{random}).$$

In step 304, the computer performs the step of computing an interconnect delay corresponding to the incident R,C parameters. Preferably, it does this by computing a total resistance ("$R_{int}$") and a total capacitance ("$C_{int}$") from the incident R,C parameters; and computing an interconnect delay from the total resistance and total capacitance using an analytical delay model. Total resistance $R_{int}$ is generally the incident resistance calculated in step 303, for example, by adding to the nominal R retrieved from the R,C nominal table 66, corresponding R,C sensitivity parameters (e.g., $\partial R/\partial \rho$ from the R,C sensitivity table 68) multiplied by differences between corresponding nominal material and geometry values and randomly generated material and geometry values (e.g., $\Delta \rho$). Total capacitance $C_{int}$ is calculated, for example, by treating the capacitances Cgu, Cgd and Ci associated with each interconnect as being connected in parallel (e.g., treating interconnect 22 as being active, while treating interconnect 21, array 10 and array 30 as being grounded).

An example of one analytical delay model is found in Bakoglu, "Circuits, Interconnections, and Packaging for VLSI", p. 204, *Addison Wesley* 1990, in which the 50% delay (i.e., the delay from 50% point of the input waveform to 50% point of the output waveform) for an interconnect delay model is presented as:

$$T_{50\%}=0.4*R_{int}*C_{int}+0.7*(R_{tr}*C_{int}+R_{tr}*C_L+R_{int}*C_L)\approx 0.4*R_{int}*C_{int}+0.7*R_{tr}*C_{int},$$

for $C_L \ll C_{int}$

This equation is further simplified when the interconnect delay dominates over the transistor delay, so that the 50% delay is approximately proportional to a product of the interconnect resistance and capacitance.

$$T_{50\%} \approx 0.4*R_{int}*C_{int},$$

for $C_L \ll C_{int}$ and $R_{tr} \ll R_{int}$

Thus, the interconnect delay per unit length can be approximated from a product of the total interconnect resistance per unit length $R_{int}$ and total interconnect capacitance per unit length $C_{int}$. As can be readily appreciated, calculation of the interconnect delay using such approximation is significantly faster than doing so by conventional SPICE simulation.

In step 305, the computer performs the step of generating a statistically significant spread of interconnect delay data for the selected interconnect arrangement, width and spacing by repeating steps 302~304.

In step 306, the computer performs the step of computing a statistically worst case interconnect delay by computing minimum and maximum 3-sigma Gaussian distribution values from the spread of interconnect delay data tabulated and stored in step 305.

In step 307, the computer performs the step of computing a representative set of material and geometry values (e.g., $\epsilon^{}$, $h1^{}$, $h2^{}$, $t^{}$, $\rho^{}$, $W^{}$, $S^{**}$) corresponding to the statistically worst case interconnect delay. Preferably, it does this by computing a minimum interconnect resistance by assuming that interconnect width is a maximum value, interconnect thickness is a maximum value and interconnect resistivity is a minimum value; computing a maximum total capacitance by dividing the worst case interconnect delay by (0.4 times the minimum interconnect resistance); calculating metal-to-metal heights by dividing corresponding capacitance-to-height sensitivities obtained from the material and geometry values into differences between corresponding interconnect nominal capacitances and the maximum total capacitance; and generating representative material and geometry values corresponding to the statistically worst case interconnect delay by including the interconnect width maximum value, the interconnect thickness maximum value, the interconnect resistivity minimum value, the generated metal-to-metal heights, and assuming all other material and geometry values to be nominal values. Such a technique is expected to provide R,C parameters generating a statistically worst case interconnect delay that is more conservative than the real 3-sigma delay.

In step 308, the computer performs the step of computing R,C parameters (e.g., $R^{}$, $Ci^{}$, $Cgu^{}$, $Cgd^{}$) corresponding to the statistically worst case interconnect delay from the representative set of material and geometry values. Preferably, it does this by retrieving R,C nominal and sensitivity parameters from an interconnect model file; and computing R,C parameters corresponding to the statistically worst interconnect delay by adding to each of the retrieved R,C nominal parameters, (corresponding retrieved R,C sensitivity parameters multiplied by (differences between nominal material and geometry values corresponding to the representative set of material and geometry values and corresponding ones of the representative set of material and geometry values)). These R,C parameters are useful for computer simulation of integrated circuit designs.

In step 309, the computer performs the step of generating a look-up table of R,C parameters corresponding to statistically worst case interconnect delays for a plurality of interconnect arrangements, and a range of interconnect widths and spacings for each of the plurality of interconnect widths and spacings, by repeating steps 301~308 each time for a different set of interconnect arrangement, width and spacing. As can be readily appreciated, such a look-up table is particularly useful in computer simulation of integrated circuit designs employing the interconnect process technology.

Although the various aspects of the present invention have been described with respect to a preferred embodiment, it will be understood that the invention is entitled to full protection within the full scope of the appended claims.

We claim:

1. A method of generating R,C parameters corresponding to statistically worst case interconnect delays for computer simulation of integrated circuit designs, comprising the steps of:

(a) computing a statistically worst case interconnect delay from randomly generated material and geometry values characterizing an integrated circuit interconnect process;

(b) computing a representative set of material and geometry values corresponding to said statistically worst case interconnect delay; and (c) computing R,C parameters corresponding to said statistically worst case interconnect delay from said representative set of material and geometry values.

2. The method according to claim 1, wherein said step (a) comprises the steps of:

(a1) randomly generating a set of material and geometry values from empirical data generated for a selected interconnect arrangement, width and spacing, characterizing the integrated circuit interconnect process;

(a2) computing incident R,C parameters from said randomly generated set of material and geometry values;

(a3) computing an interconnect delay corresponding to said incident R,C parameters; and (a4) computing a statistically worst case interconnect delay for said selected interconnect arrangement, width and spacing, from interconnect delay data generated by repeating steps (a1) through (a3).

3. The method according to claim 2, wherein said step (a1) comprises the step of performing a Monte Carlo simulation on an interconnect technology file including material and geometry values corresponding to said selected interconnect arrangement, width and spacing.

4. The method according to claim 2, wherein said step (a2) comprises the steps of:

retrieving R,C nominal and sensitivity parameters corresponding to said selected interconnect arrangement, width and spacing, from an interconnect model file; and computing incident R,C parameters by adding to each of said retrieved R,C nominal parameters, (corresponding retrieved R,C sensitivity parameters multiplied by (differences between nominal material and geometry values corresponding to said randomly generated material and geometry values, and said randomly generated material and geometry values)).

5. The method according to claim 2, wherein said step (a3) comprises the steps of:

computing a total resistance and a total capacitance from said incident R,C parameters; and computing an interconnect delay from said total resistance and said total capacitance using an analytical delay model.

6. The method according to claim 5, wherein said step of computing an interconnect delay from said total resistance and said total capacitance using an analytical delay model, comprises the step of approximating said interconnect delay from a product of said total resistance and said total capacitance.

7. The method according to claim 2, wherein said step (a4) comprises the steps of:

repeating steps (a1) through (a3) to generate a statistically significant spread of interconnect delay data; and computing minimum and maximum 3-sigma values from said spread of interconnect delay data.

8. The method according to claim 1, wherein said step (b) comprises the steps of:

computing a minimum interconnect resistance by assuming that interconnect width is a maximum value, interconnect thickness is a maximum value and interconnect resistivity is a minimum value;

computing a maximum total capacitance by dividing said worst case interconnect delay by said minimum interconnect resistance;

calculating metal-to-metal heights by dividing corresponding capacitance-to-height sensitivities obtained from said material and geometry values into differences between corresponding interconnect nominal capacitances and said maximum total capacitance; and generating representative material and geometry values corresponding to said statistically worst case interconnect delay by including said interconnect width maximum value, said interconnect thickness maximum value, said interconnect resistivity minimum value, said generated metal-to-metal heights, and assuming all other material and geometry values to be nominal values.

9. The method according to claim 1, wherein said step (c) comprises the steps of:

retrieving R,C nominal and sensitivity parameters from an interconnect model file; and computing R,C parameters corresponding to said statistically worst interconnect delay by adding to each of said retrieved R,C nominal parameters, (corresponding retrieved R,C sensitivity parameters multiplied by (differences between nominal material and geometry values corresponding to said representative set of material and geometry values and corresponding ones of said representative set of material and geometry values)).

10. The method according to claim 1, further comprising the step of generating a table of R,C parameters corresponding to statistically worst case interconnect delays for a plurality of interconnect arrangements, and a range of interconnect widths and spacings for each of said plurality of interconnect widths and spacings, by repeating steps (a) through (c) each time for a different set of interconnect arrangement, width and spacing.

* * * * *